(12) United States Patent
Morgan

(10) Patent No.: US 9,360,899 B2
(45) Date of Patent: Jun. 7, 2016

(54) COMMUNICATION MODULE HAVING A ROTATABLE CONNECTOR ASSEMBLY FOR MULTIPLE CONNECTION ORIENTATIONS

(71) Applicant: Adtran, Inc., Huntsville, AL (US)

(72) Inventor: Joshua Daniel Morgan, Huntsville, AL (US)

(73) Assignee: Adtran, Inc., Huntsville, AL (US)

( * ) Notice: Subject to any disclaimer, the term of this patent is extended or adjusted under 35 U.S.C. 154(b) by 161 days.

(21) Appl. No.: 14/170,909

(22) Filed: Feb. 3, 2014

(65) Prior Publication Data
US 2015/0222363 A1 Aug. 6, 2015

(51) Int. Cl.
*H04B 10/00* (2013.01)
*G06F 1/18* (2006.01)
*H05K 7/14* (2006.01)
*G02B 6/42* (2006.01)

(52) U.S. Cl.
CPC .............. *G06F 1/186* (2013.01); *G02B 6/4284* (2013.01); *H05K 7/1452* (2013.01)

(58) Field of Classification Search
CPC ............................. H04B 10/40; H04B 10/2504
See application file for complete search history.

(56) References Cited

U.S. PATENT DOCUMENTS

| 3,377,515 | A | 4/1968 | Erb | |
|---|---|---|---|---|
| 6,282,099 | B1 | 8/2001 | Wilson et al. | |
| 6,926,548 | B2 | 8/2005 | Reasoner et al. | |
| 7,304,856 | B2 | 12/2007 | Andretta | |
| 2010/0322563 | A1* | 12/2010 | Melton | G02B 6/4433 385/59 |
| 2011/0222821 | A1* | 9/2011 | Pitwon | G02B 6/3897 385/92 |
| 2013/0115821 | A1* | 5/2013 | Golko | H01R 13/516 439/638 |
| 2015/0071590 | A1* | 3/2015 | Wu | H01R 13/504 385/56 |
| 2015/0257301 | A1 | 9/2015 | Morgan et al. | |

* cited by examiner

*Primary Examiner* — Dzung Tran
(74) *Attorney, Agent, or Firm* — Smith Tempel Blaha LLC; Michael J. Tempel

(57) ABSTRACT

An optical communication module include a housing having a circuit element configured to provide an optical communication function, and a rotatable connector assembly coupled to the housing, the rotatable connector assembly configured to rotate between a first position and a second position, wherein when in the first position, the rotatable connector assembly allows the communication module to interface with a first form factor card cage and when in the second position, the rotatable connector assembly allows the communication module to interface with a second form factor card cage.

18 Claims, 7 Drawing Sheets

COMMUNICATION MODULE HAVING A ROTATABLE CONNECTOR ASSEMBLY FOR MULTIPLE CONNECTION ORIENTATIONS

BACKGROUND

In many communication applications and installations, a card cage is used to house a number of communication modules. A card cage typically has a main circuit board, referred to as a "backplane" to which the communication modules electrically connect. While it may not be desirable for every communication module to connect to the backplane for operational purposes, it is desired that each communication module connect to the backplane, at least to communicate the presence of the communication module to the system and for inventory purposes. Each communication module may be one of a similar type of module, or each communication module may be different from an adjoining communication module. Moreover, it may be desirable to have the ability to connect similar communication modules to different card cage and backplane form factors having different mechanical configurations. This frequently occurs where it is desirable to use a standard communication module for a number of different form factor applications. In such instances, an adapter may be used to allow the communication module to connect to more than one card cage and backplane configuration.

An example of a communication module is a passive optical module (POM). In some applications, it is desirable to have the ability to install a POM in at least two or more different systems. However, often the two systems are not mechanically identical, and in particular, may not have the same depth. An adapter/extender could be implemented and attached to the POM, but such a solution adds cost, complexity, and increases chances for misalignment of the communication module within the card cage.

Therefore, it would be desirable to have a way of installing a communication module in two or more systems having different form factors.

SUMMARY

Embodiments of an optical communication module include a housing having a circuit element configured to provide an optical communication function, and a rotatable connector assembly coupled to the housing, the rotatable connector assembly configured to rotate between a first position and a second position, wherein when in the first position, the rotatable connector assembly allows the communication module to interface with a first form factor card cage and when in the second position, the rotatable connector assembly allows the communication module to interface with a second form factor card cage.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

Exemplary embodiments of the invention can be better understood with reference to the following figures. The components within the figures are not necessarily to scale, emphasis instead being placed upon clearly illustrating the principles of the invention. Moreover, in the figures, like reference numerals designate corresponding parts throughout the different views.

DETAILED DESCRIPTION

There are many instances where it would be desirable to allow a communication module to interface to multiple card cage and backplane configurations. A communication module includes a housing having embodiments of a rotatable connector assembly integrated with the communication module. The rotatable connector assembly can be, for example, a printed circuit board (PCB), a passive circuit element, an active circuit element, a spacer having circuitry, or another type of rotatable adapter. In an embodiment, the rotatable connector assembly can be a PCB, or can be fabricated from material that is also used to fabricate a PCB, and can include two sets of electrical contacts oriented orthogonally, or at other angles, with respect to each other. In an embodiment, the rotatable connector assembly is rotatable by at least 90 degrees, thus allowing each of the two orthogonally oriented sets of electrical contacts to be reoriented by 90 degrees by a customer or other user of the system. Having a rotatable connector arrangement capable of multiple orientations allows the communication module to interface with at least two different card cage and backplane form factor configurations. Such a rotatable connector assembly eliminates the need for a separate adapter for each different card cage/backplane arrangement, and allows a single passive or active communication module to fit two or more different card cage and backplane form factors without any additional adapter hardware. The rotatable connector assembly allows a communication module to be used in at least two different card cage and/or backplane arrangements having different depths by allowing a communication module to have different effective connection lengths, depending on the orientation of the rotatable connector assembly. In an embodiment, the rotatable connector assembly can comprise an active circuit or a passive circuit, or can be a non-active element designed only for mechanical fit. In an embodiment, the rotatable connector assembly is not necessarily electrically connected to the communication module, but instead, can provide only presence and inventory information.

Although described with particular reference to an optical communication module (or a passive optical module ((POM)), embodiments of the rotatable connector assembly for multiple connection orientations can be used in any application in which it is desirable to adapt an electronics module or card to fit in multiple different form factor card cage and/or backplane arrangements.

Figure 1:
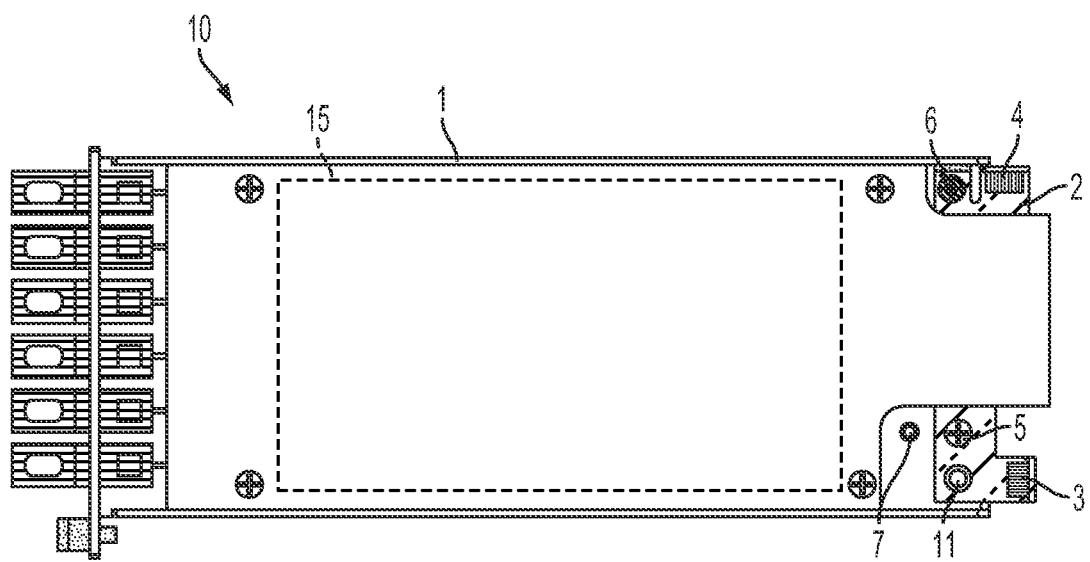
FIG. 1 shows a diagram of a communications module including an embodiment of a rotatable connector assembly.

FIG. 1 shows a diagram of a communication module 10 including an embodiment of a rotatable connector assembly. The communication module 10 includes a circuit element 15 located in a housing 1. The communication module 10 can be an active communication module, a passive communication module, and in an embodiment, can be a passive optical module (POM) configured to provide a passive optical communication function. The circuit element 15 can provide passive or active communication functionality. The housing 1 includes a rotatable connector assembly 2 oriented in a first position. The rotatable connector assembly 2 can be fabricated from the same material from which a printed circuit board (PCB) is fabricated, can be fabricated from a material other than which a PCB is fabricated, or can be an element comprised of a combination of materials. In an embodiment the rotatable connector assembly 2 can be a printed circuit board having electrical contacts. In an embodiment, the rotatable connector assembly 2 includes a first set of electrical contacts 3 and a second set of electrical contacts 4. Although shown as having more than one electrical contact, each of the first set of electrical contacts 3 and the second set of electrical contacts 4 may comprise one or more electrical contacts. The first set of electrical contacts 3 is oriented differently than the second set of electrical contacts 4. In an embodiment, the first set of electrical contacts 3 is oriented substantially orthogonal to the second set of electrical contacts 4. However, other differences in orientation between the first set of electrical contacts 3 and the second set of electrical contacts 4 are possible, including differences in orientation ranging from approximately 20 degrees to approximately 90 degrees. The difference in orientation between and among the sets of electrical contacts is at least partially dependent on the total number of sets of electrical contacts, and in different embodiments, can be from 0 degrees to 360 degrees. Further, although two sets of electrical contacts are shown, the rotatable connector assembly 2 may have more than two sets of electrical contacts configured for more than two different positions, each set of electrical contacts facilitating a unique connection orientation.

In the example shown in FIG. 1, the first set of electrical contacts 3 is oriented to interface with a backplane (not shown) while the second set of electrical contacts 4 are not oriented to interface with a backplane (not shown). A securing means 5, such as a screw, a rivet, or another fixed or removable means, retains the rotatable connector assembly 2 in the housing 1 while allowing the rotatable connector assembly 2 to rotate through a defined arc. In an embodiment, the securing means 5 is a removable screw 5. A second removable securing means, such as a screw 6, secures the rotatable connector assembly 2 in the first position. A boss 7 is adapted to receive a screw or other securing means (not shown in FIG. 1) through a hole 11 to maintain the rotatable connector assembly 2 in a second position after being rotated into a second position, as described below.

Figure 2:
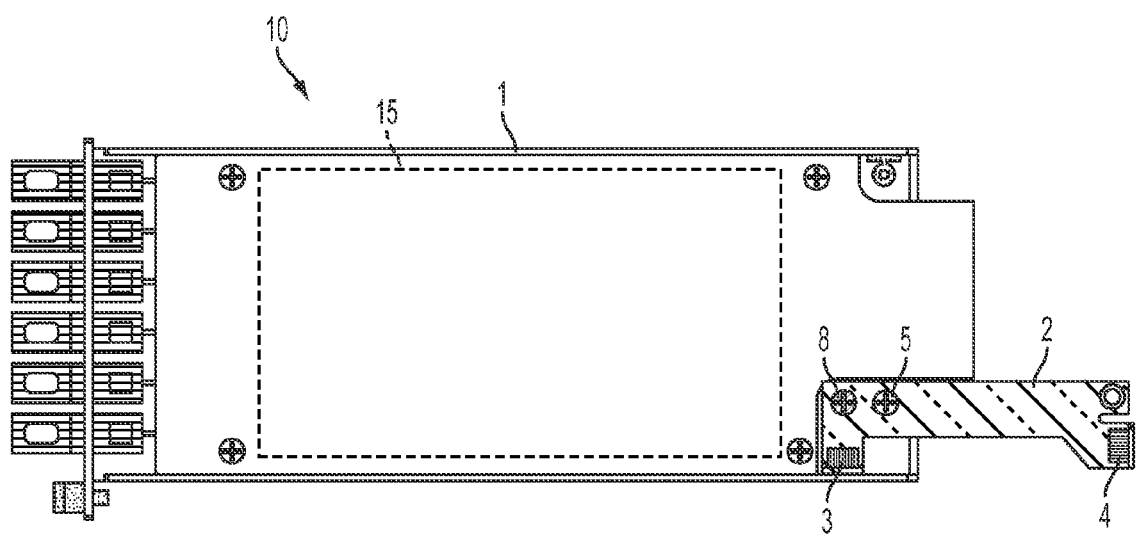
FIG. 2 shows a diagram of the communications module of FIG. 1 having the rotatable connector assembly oriented in a second position.

FIG. 2 shows a diagram of the communications module having the rotatable connector assembly 2 oriented in a second position. In the embodiment shown, the first position of the rotatable connector assembly 2 shown in FIG. 1 differs from the second position of the rotatable connector assembly 2 shown in FIG. 2 by approximately 90 degrees. However, other differences in orientation and position between the first position and the second position are possible, including differences in position ranging from approximately 20 degrees to approximately 90 degrees, or more, depending on the number of sets of electrical contacts. In the example shown in FIG. 2, the second set of electrical contacts 4 is oriented to interface with a backplane (not shown) that is different from the backplane with which the first set of electrical contacts 3 could interface. A removable securing means, such as a screw 8, or other removable means, is located in the boss 7 (not shown in FIG. 2) to releasably secure the rotatable connector assembly 2 in the second position. As shown in FIGS. 1 and 2, the rotatable connector assembly 2 allows the communication module 1 to interface with at least two different card cage and backplane configurations.

Figure 3:
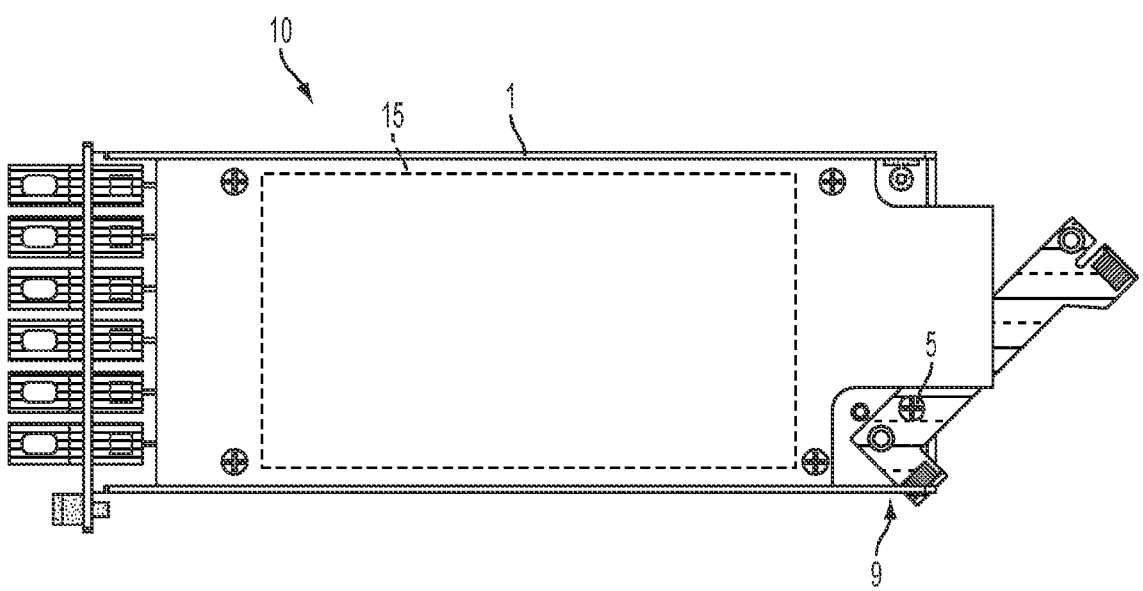
FIG. 3 is a diagram illustrating another embodiment of a rotatable connector assembly.

FIG. 3 is a diagram illustrating another embodiment of a rotatable connector assembly. The communication module 10 includes a slot 9 in the housing 1 that allows the rotatable connector assembly 2 to rotate through an arc, portions of which cause the rotatable connector assembly 2 to exceed the boundary of the housing 1, while allowing the rotatable connector assembly 2 to remain attached to the housing 1 of the communication module 10 by the screw 5.

Figure 4:
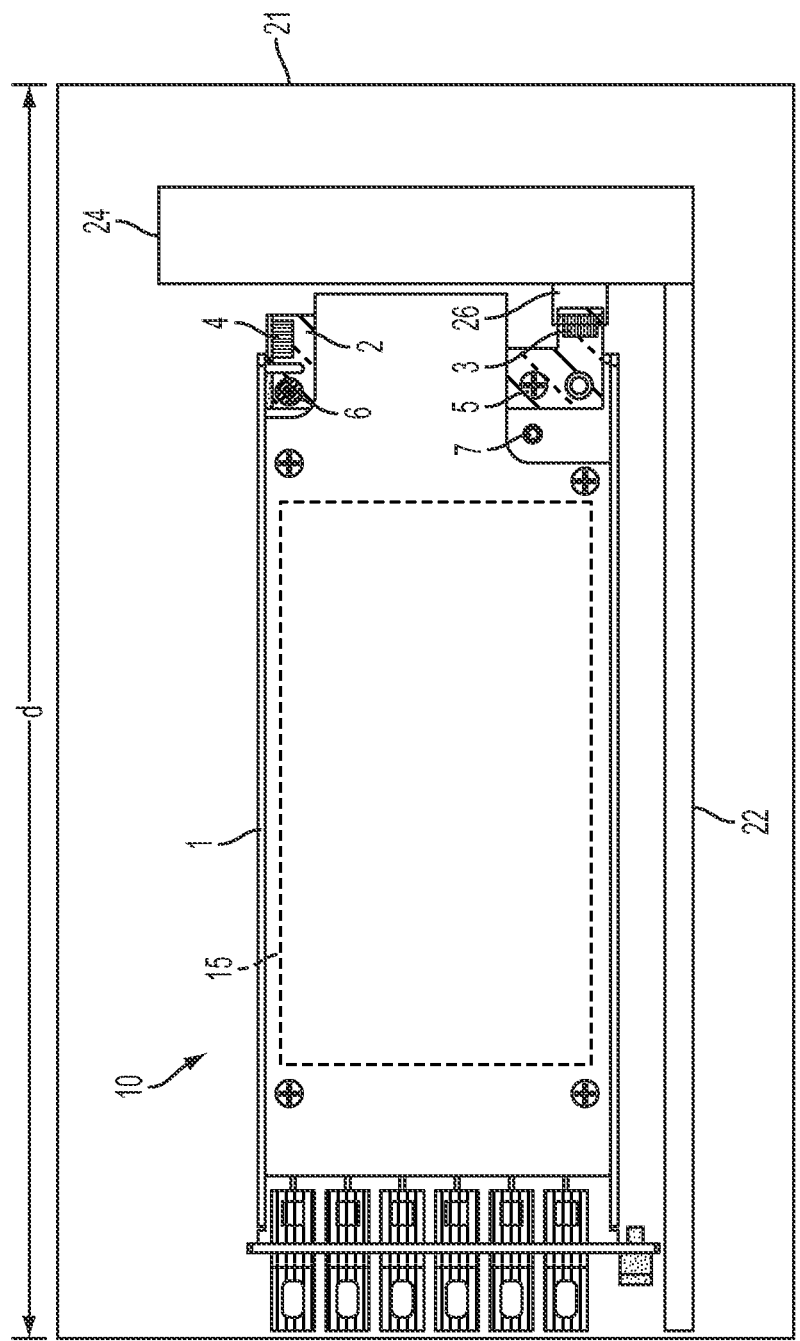
FIG. 4 is a diagram illustrating the communications module of FIG. 1 in a first exemplary application.

FIG. 4 is a diagram illustrating the communication module 10 of FIG. 1 in a first application. The communication module 10 is located in a schematic representation of a card cage 21. The card cage 21 is an example of a housing, system, carrier, or other form factor that can receive, house, contain, connect, or otherwise engage one or more communication modules 10. The card cage 21 is shown in basic schematic form to illustrate that it may take many different forms. In an embodiment, the card cage 21 comprises a card guide 22 configured to releasably and slidably hold and direct the communication module 10 within the card cage 21 in a preferred orientation. The card cage 21 also comprises a backplane 24. The backplane 24 typically is a PCB that includes circuitry and connectors configured to mechanically and electrically interface with the communication module 10. The card guide 22 and the backplane 24 are located in a relationship that allows the card guide 22 to direct the communication module 10 toward the backplane 24 so that the communication module 10 can be mechanically and electrically connected to the backplane 24. In this example, the backplane 24 comprises a backplane connector 26 configured to engage and mate with the electrical contacts 3 of the communication module 10 when the rotatable connector assembly 2 is in the first position as shown in FIG. 1. The dimension "d" illustrates an example depth of the card cage 21. One or more other electrical connectors that connect the circuit element 15 to the backplane 24 are omitted from FIG. 4 for clarity of explanation.

Figure 5:
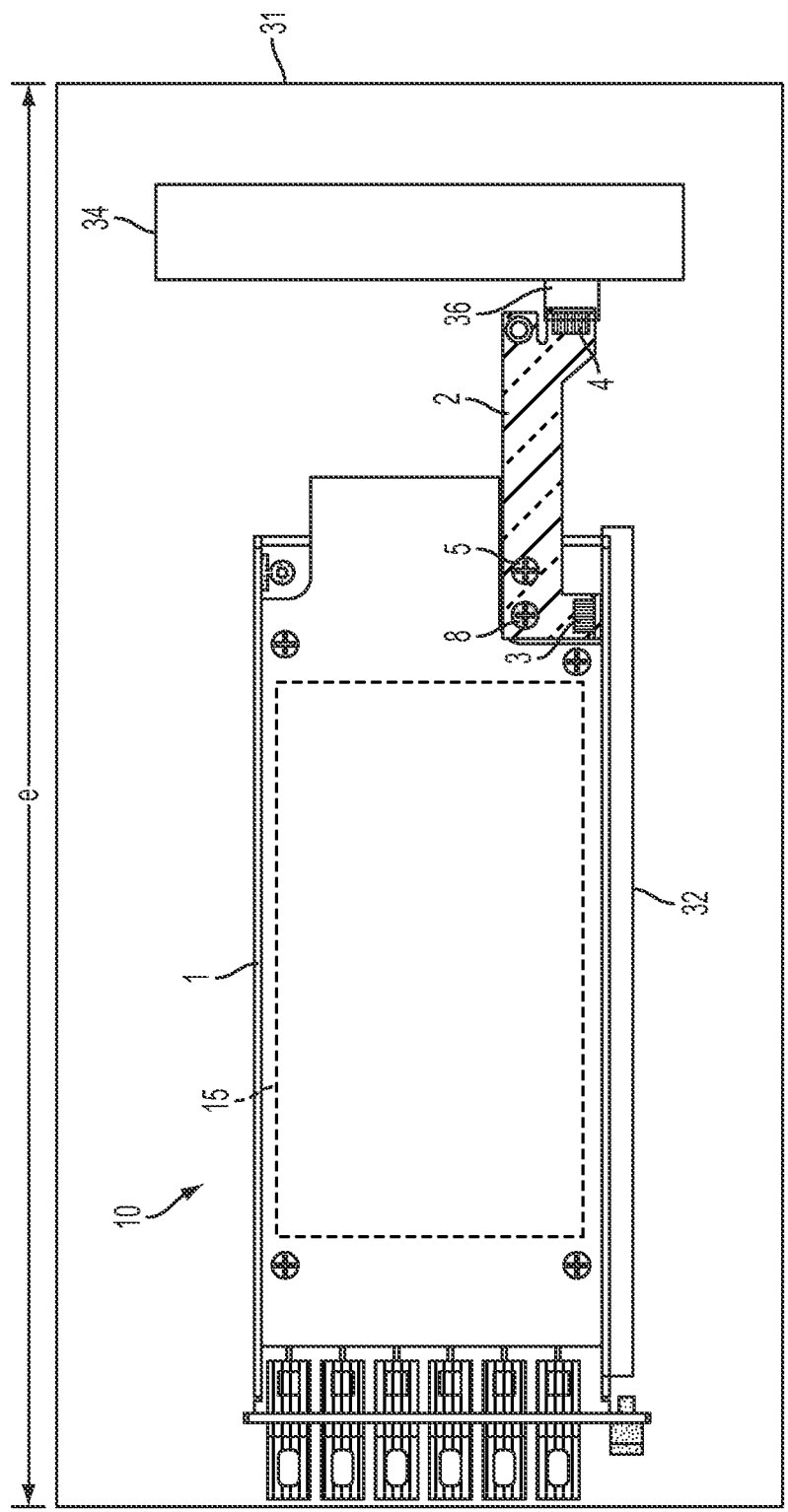
FIG. 5 is a diagram illustrating the communications module of FIG. 2 in a second exemplary application.

FIG. 5 is a diagram illustrating the communication module 10 of FIG. 2 in a second application. The communication module 10 is located in a card cage 31. The card cage 31 is an example of a housing, system, carrier, or other form factor that can house, contain, connect, or otherwise engage one or more communication modules 10, and can be similar to the card cage 21 (FIG. 4) in many aspects. The card cage 31 is shown in basic schematic form to illustrate that it may take many forms. In an embodiment, the card cage 31 comprises a card guide 32 configured to releasably and slidably hold the communication module 10 within the card cage 31 in a preferred orientation. The card cage 31 also comprises a backplane 34. The backplane 34 typically is a PCB that includes circuitry and connectors configured to mechanically and electrically interface with the communication module 10. The card guide 32 and the backplane 34 are located in a relationship that allows the card guide 32 to direct the communication module 10 toward the backplane 34 so that the communication module 10 can be mechanically and electrically connected to the backplane 34. In this example, the backplane 34 comprises a backplane connector 36 configured to engage and mate with the electrical contacts 4 of the communication module 10 when the rotatable connector assembly 2 is in the second position as shown in FIG. 2. The dimension "e" illustrates an example depth of the card cage 31 that is different from the dimension "d" of the card cage 21 shown in FIG. 4. In this manner, the rotatable connector assembly 2 allows the communication module 10 to be used in a plurality of form factor systems. One or more other electrical connectors that connect the circuit element 15 to the backplane 34 are omitted from FIG. 5 for clarity of explanation.

Figure 6:
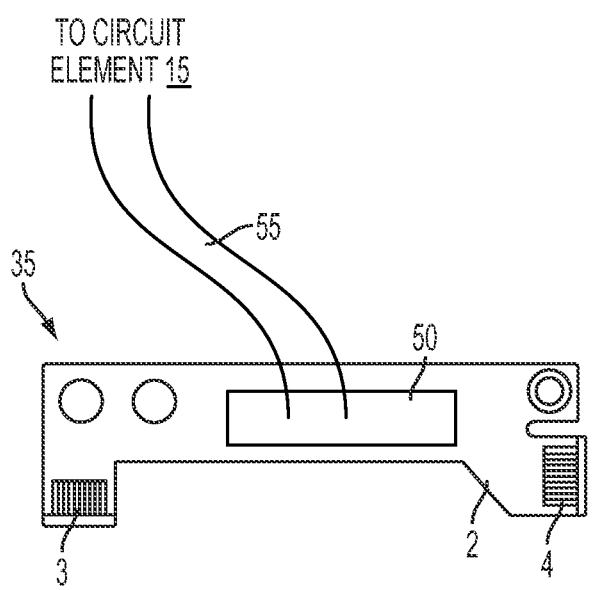
FIG. 6 is a diagram illustrating an embodiment of the rotatable connector assembly of FIG. 1 and FIG. 2.

FIG. 6 is a diagram illustrating an embodiment of the rotatable connector assembly 2 of FIG. 1 and FIG. 2. The rotatable connector assembly 35 is similar to the rotatable connector assembly 2 described above, but in this embodiment, comprises a circuit element 50. The circuit element 50 can be a passive circuit or can be an active circuit. In an embodiment, the circuit 50 can be used to identify the presence of the communication module 10. The circuit element 50 can be a passive circuit, such as a radio frequency identification (RFID) circuit that provides a response when interrogated by a RFID transmitter, or can be an active circuit. Moreover, the rotatable connector assembly 35 can be implemented with or without the circuit element 50 as a way to interface the communication module 10 to a plurality of card cages/backplanes.

In an alternative embodiment, the rotatable connector assembly 35 may comprise flexible circuitry 55 to allow the rotatable connector assembly 35 to connect to an active element within the communication module 10, such as the circuit element 15, so that the rotatable connector assembly 35 provides both a mechanical interface and an electrical interface between a backplane and the communication module 10.

Figure 7:
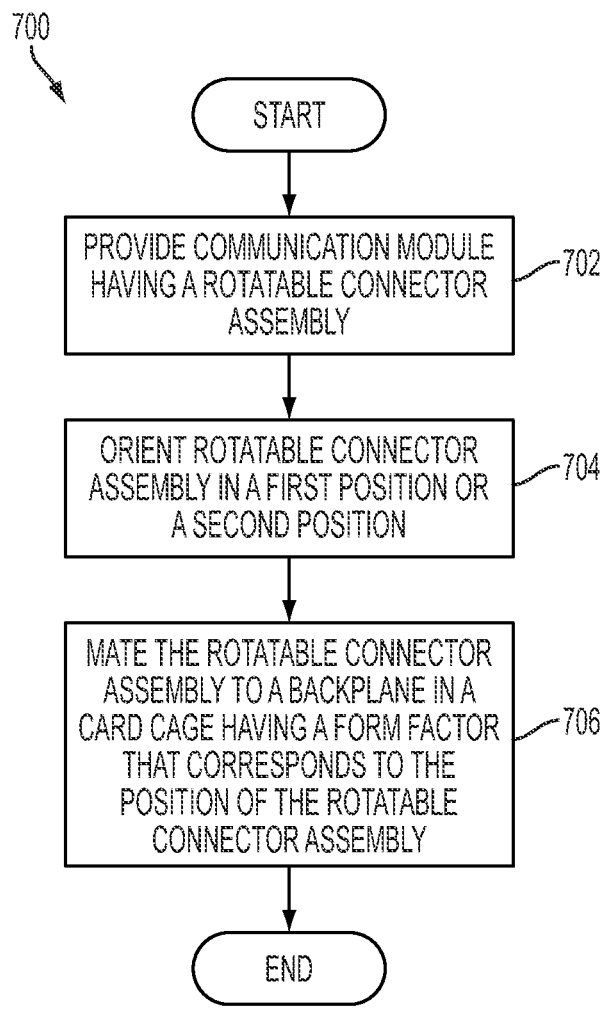
FIG. 7 is a flow chart describing the operation of an embodiment of a method for using a rotatable connector assembly.

FIG. 7 is a flow chart describing the operation of an embodiment of a method for using a rotatable connector assembly. The steps in the flow chart 700 can be performed in or out of the order shown, and in some instances, may be performed in parallel.

In block 702, a communication module having a rotatable connector assembly is provided.

In block 704, the rotatable connector assembly is oriented in a first position or a second position.

In block 706, the rotatable connector assembly is mated to a backplane in a card cage having a form factor corresponding to the first position or a second position of the rotatable connector assembly.

While various embodiments of the invention have been described, it will be apparent to those of ordinary skill in the art that many more embodiments and implementations are possible that are within the scope of this invention.

What is claimed is:

1. A communication module, comprising:
a housing having a first circuit element configured to provide a communication function; and
a rotatable connector assembly pivotally coupled to the housing, the rotatable connector assembly configured to rotate between a first position and a second position, wherein when in the first position, the rotatable connector assembly allows the communication module to interface with a first card cage having a first depth and when in the second position, the rotatable connector assembly allows the communication module to interface with a second card cage having a second depth greater than the first depth, the housing and rotatable connector assembly together extending a first length when the rotatable connector assembly is in the first position to interface with the first card cage, the housing and rotatable connector assembly together extending a second length greater than the first length when the rotatable connector assembly is in the second position to interface with the second card cage.

2. The communication module of claim 1, further comprising a slot in the housing, the slot configured to allow the rotatable connector assembly to rotate between the first position and the second position without removing the rotatable connector assembly from the housing.

3. The communication module of claim 2, wherein the first position and the second position are different by approximately 20 degrees to approximately 90 degrees.

4. The communication module of claim 3, wherein the rotatable connector assembly further comprises a first set of electrical contacts and a second set of electrical contacts, the first set of electrical contacts and the second set of electrical contacts oriented approximately 20 degrees to approximately 90 degrees with respect to each other.

5. The communication module of claim 4, wherein the rotatable connector assembly further comprises a second circuit element configured to identify the presence of the optical communication module to the housing by communicating with the first circuit element.

6. The communication module of claim 5, wherein the second circuit element is electrically coupled to the first circuit element on the optical communication module.

7. The communication module of claim 6, wherein the rotatable connector assembly provides a mechanical interface and an electrical interface between the optical communication module and a backplane located in the card cage.

8. The communication module of claim 4, wherein the second circuit element comprises active circuitry.

9. The communication module of claim 4, wherein the second circuit element comprises passive circuitry.

10. A method for providing communication module, comprising:
providing a housing having a first circuit element configured to provide a communication function; and
pivotally coupling a rotatable connector assembly to the housing, the rotatable connector assembly configured to rotate between a first position and a second position, wherein when in the first position, the rotatable connector assembly allows the communication module to interface with a first card cage having a first depth and when in the second position, the rotatable connector assembly allows the communication module to interface with a second card cage having a second depth greater than the first depth, the housing and rotatable connector assembly together extending a first length when the rotatable connector assembly is in the first position to interface with the first card cage, the housing and rotatable connector assembly together extending a second length greater than the first length when the rotatable connector assembly is in the second position to interface with the second card cage.

11. The method of claim 10, further comprising providing a slot in the housing, the slot allowing the rotatable connector assembly to rotate between the first position and the second position without removing the rotatable connector assembly from the housing.

12. The method of claim 11, wherein the first position and the second position are different by approximately 20 degrees to approximately 90 degrees.

13. The method of claim 12, further comprising:
providing on the rotatable connector assembly a first set of electrical contacts and a second set of electrical contacts;
orienting the first set of electrical contacts and the second set of electrical contacts approximately 20 degrees to approximately 90 degrees with respect to each other.

14. The method of claim 13, further comprising providing on the rotatable connector assembly a second circuit element configured to identify the presence of the optical communication module to the housing by communicating with the first circuit element.

15. The method of claim 14, further comprising electrically coupling the second circuit element to the circuit element on the optical communication module.

16. The method of claim 14, wherein the rotatable connector assembly provides a mechanical interface and an electrical interface between the optical communication module and a backplane located in the card cage.

17. The method of claim 13, wherein the second circuit element comprises active circuitry.

18. The method of claim 13, wherein the second circuit element comprises passive circuitry.

* * * * *